United States Patent
Takken et al.

(10) Patent No.: US 11,799,384 B2
(45) Date of Patent: Oct. 24, 2023

(54) POWER CONVERTER WITH CO-PACKAGED SECONDARY FIELD EFFECT TRANSISTORS (FETS)

(71) Applicant: International Business Machines Corporation, Armonk, NY (US)

(72) Inventors: Todd Edward Takken, Brewster, NY (US); Xin Zhang, Chappaqua, NY (US); Andrew Ferencz, Southborough, MA (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 16/774,960

(22) Filed: Jan. 28, 2020

(65) Prior Publication Data

US 2021/0234465 A1    Jul. 29, 2021

(51) Int. Cl.
*H02M 3/335* (2006.01)
*H01L 25/07* (2006.01)
*H02M 3/00* (2006.01)

(52) U.S. Cl.
CPC ...... *H02M 3/33576* (2013.01); *H01L 25/074* (2013.01); *H02M 3/003* (2021.05)

(58) Field of Classification Search
CPC .............................................. H02M 3/335–42
See application file for complete search history.

(56) References Cited

U.S. PATENT DOCUMENTS

| | | | |
|---|---|---|---|
| 6,169,675 B1* | 1/2001 | Shimamori | H02M 3/285 363/127 |
| 7,872,879 B2 | 1/2011 | Degen et al. | |
| 8,546,221 B2 | 10/2013 | Girdhar et al. | |
| 9,621,044 B2 | 4/2017 | Zhang et al. | |
| 9,899,929 B2* | 2/2018 | Jitaru | H02M 3/33592 |
| 2003/0198067 A1* | 10/2003 | Sun | H01F 30/06 363/53 |
| 2004/0136207 A1* | 7/2004 | Havanur | H02M 3/33592 363/21.06 |
| 2009/0160424 A1* | 6/2009 | Yamamoto | H05K 3/3468 363/21.13 |
| 2018/0138112 A1* | 5/2018 | Ranmuthu | H01L 23/49568 |
| 2019/0115788 A1 | 4/2019 | Zhang | |
| 2019/0237416 A1* | 8/2019 | Gao | H01L 23/49827 |
| 2021/0090980 A1* | 3/2021 | Noquil | H01L 24/17 |

FOREIGN PATENT DOCUMENTS

WO    WO-9324987 A1 * 12/1993    ............. H02M 1/14

* cited by examiner

*Primary Examiner* — Peter M Novak
(74) *Attorney, Agent, or Firm* — Scully, Scott, Murphy & Presser, P.C.; Daniel P. Morris

(57) ABSTRACT

A power converter with co-packaged secondary field effect transistors (FETs) are described. The power converter can include a first circuit, a transformer connected to an output of the first circuit, and a second circuit connected to an output of the transformer. The second circuit can include an inductor, a first FET coupled between the transformer and the inductor, and a second FET coupled between the first FET and ground. The first FET and the second FET can be co-packaged as a single package.

20 Claims, 6 Drawing Sheets

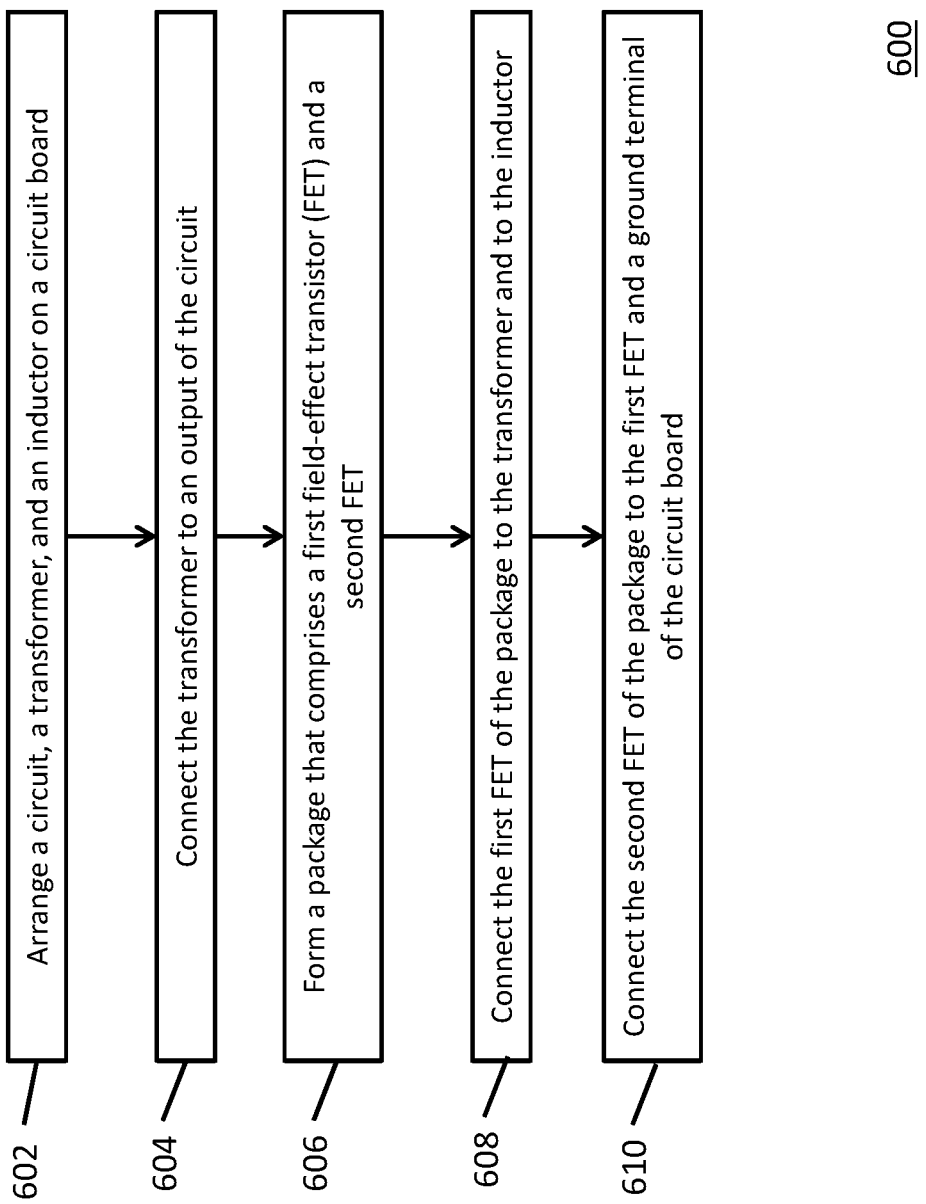

POWER CONVERTER WITH CO-PACKAGED SECONDARY FIELD EFFECT TRANSISTORS (FETS)

STATEMENT REGARDING FEDERALLY SPONSORED RESEARCH OR DEVELOPMENT

This invention was made with Government support under Contract No. B621073 awarded by the Department of Energy. The Government has certain rights to this invention.

BACKGROUND

The present disclosure relates in general to power converters that utilize a transformer to alter output voltage.

A power converter, such as a forward converter, can use a transformer to increase or decrease voltages. The transformer can include a primary inductor and a secondary inductor magnetically coupled to each other. The amount in which voltage is increased or decreased can be based on a ratio between the size (e.g., winding size) of the primary and secondary inductors. The primary inductor can be connected to a primary circuit (e.g., input section of the power converter) and the secondary inductor can be connected to a secondary circuit (e.g., section of the power converter that receives current from the secondary inductor of the transformer). The primary circuit can receive an input voltage, and the secondary circuit can output voltage that results from the transformer increasing or decreasing the input voltage.

SUMMARY

In some examples, a structure is generally described. The structure can include a transformer, an inductor, and a circuit. The circuit can include a first field-effect transistor (FET) and a second FET. The first FET can be coupled between the transformer and the inductor. The second FET can be coupled between the first FET and ground.

In some examples, a power converter is generally described. The power converter can include a first circuit, a transformer connected to an output of the first circuit, and a second circuit connected to an output of the transformer. The second circuit can include an inductor, a first field-effect transistor (FET) that can be coupled between the transformer and the inductor, and a second FET that can be coupled between the first FET and ground.

In some examples, a method of constructing a power converter is generally described. The method can include arranging a circuit, a transformer, and an inductor on a circuit board. The method can further include connecting the transformer to an output of the circuit. The method can further include forming a package that comprises a first field-effect transistor (FET) and a second FET. The method can further include connecting the first FET of the package to the transformer and to the inductor. The method can further include connecting the second FET of the package to the first FET and a ground terminal of the circuit board.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 6 is a flow diagram illustrating a process that can be performed to form a power converter with co-packaged secondary field effect transistors (FETs) in one embodiment.

DETAILED DESCRIPTION

Figure 1:
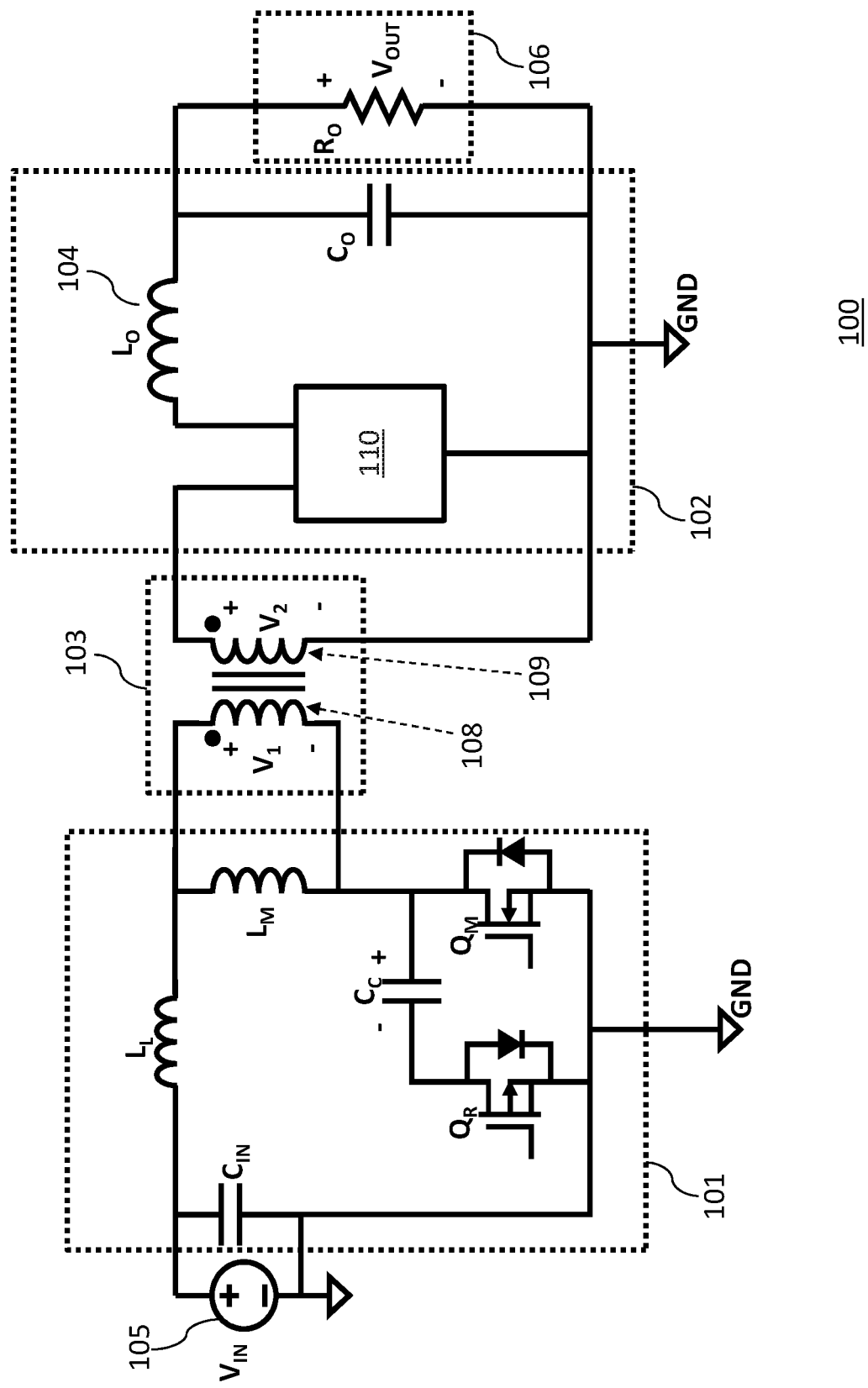
FIG. 1 illustrates a circuit diagram of a power converter with co-packaged secondary FETs in one embodiment.

FIG. 1 illustrates a circuit diagram of a power converter 100 with co-packaged secondary field effect transistors (FETs) in one embodiment. In an example, secondary FETs can be FETs that are located in a secondary circuit of a power converter. The power converter 100 can include a primary circuit 101 (or a control circuit), a secondary circuit 102 (or a filter circuit), and a transformer 103. The primary circuit 101 can control a flow of current from an input terminal 105 to the transformer 103. The secondary circuit 102 can control a flow of current outputted by the transformer 103 towards a load 106 (e.g., $R_O$).

The example power converter 100 shown in FIG. 1 can be an active clamp forward converter. The primary circuit 101 of an active clamp forward converter can include field-effect transistors (FETs) denoted as $Q_R$ and $Q_M$, and a clamping capacitor denoted as $C_C$. The FETs $Q_R$ and $Q_M$ can be metal-oxide-semiconductor field-effect transistors (MOSFETs), and can include respective body diode. The FETs $Q_R$ and $Q_M$ can be referred to as primary FETs, such as FETs located in the primary circuit 101. The FET $Q_M$ can operate as a main switch of the power converter 100 operable to switch the power converter 100 ON or OFF. When $Q_M$ is switched ON, current can flow from the input terminal 105 towards the transformer 103. When $Q_M$ is switched OFF, current may not be able to flow from the input terminal 105 and the transformer 103 to FET $Q_M$. The FET $Q_R$ can be an auxiliary switch, and can be used with the clamping capacitor $C_c$ to reset residual energy flux from the transformer 103. In FIG. 1, $L_L$ denotes the leakage inductance of the transformer 103 and $L_M$ denotes the magnetizing inductance of the transformer 103.

The transformer 103 can include a pair of inductors or windings, such as a first winding 108 and a second winding 109. The winding 108 can be connected to an output of the primary circuit 101, and the winding 109 can be connected to the load 106 through the secondary circuit 102. An input voltage measured at the input terminal 105 can be denoted as YIN. The winding 108 of the transformer 103 can receive current from the input terminal 105, through the primary circuit 101. A voltage measured at the winding 108 can be denoted as V1. The transformer 103 can either increase or decrease V1, resulting in a measurement of voltage V2 at the winding 109. A difference between V1 and V2 can be based on sizes (e.g., number of turns) of the winding 108 and the winding 109. For example, the difference between V1 and V2 can be based on a ratio of the size of the winding to the size of the winding 109. Current can flow from the transformer 103 towards the load 106, where an output voltage measured at the load 106 can be denoted as VOUT.

The secondary circuit 102 can include a circuit 110, an output inductor 104 (denoted as $L_O$), and an output capacitor $C_O$. The circuit 110 can be an electronic package, a circuit, or a device, that includes electronic components (e.g., transistors) connected to each other. The circuit 110 can be connected to the load 106. In some examples, the load 106 (denoted as $R_O$), the output inductor 104, and the output capacitor $C_O$, can form a RLC circuit (a circuit with a resistor (R), an inductor (L), a capacitor (C)) that operates as a low pass filter. To be described in more detail below, the circuit 110 can occupy a relatively small area on a circuit board being used to construct the power converter 100. Further, the arrangement of components within the circuit 110 can provide a reduction in parasitic loss that may result from, for example, a manufacturing process of one or more portions of the power converter 100.

Figure 2:
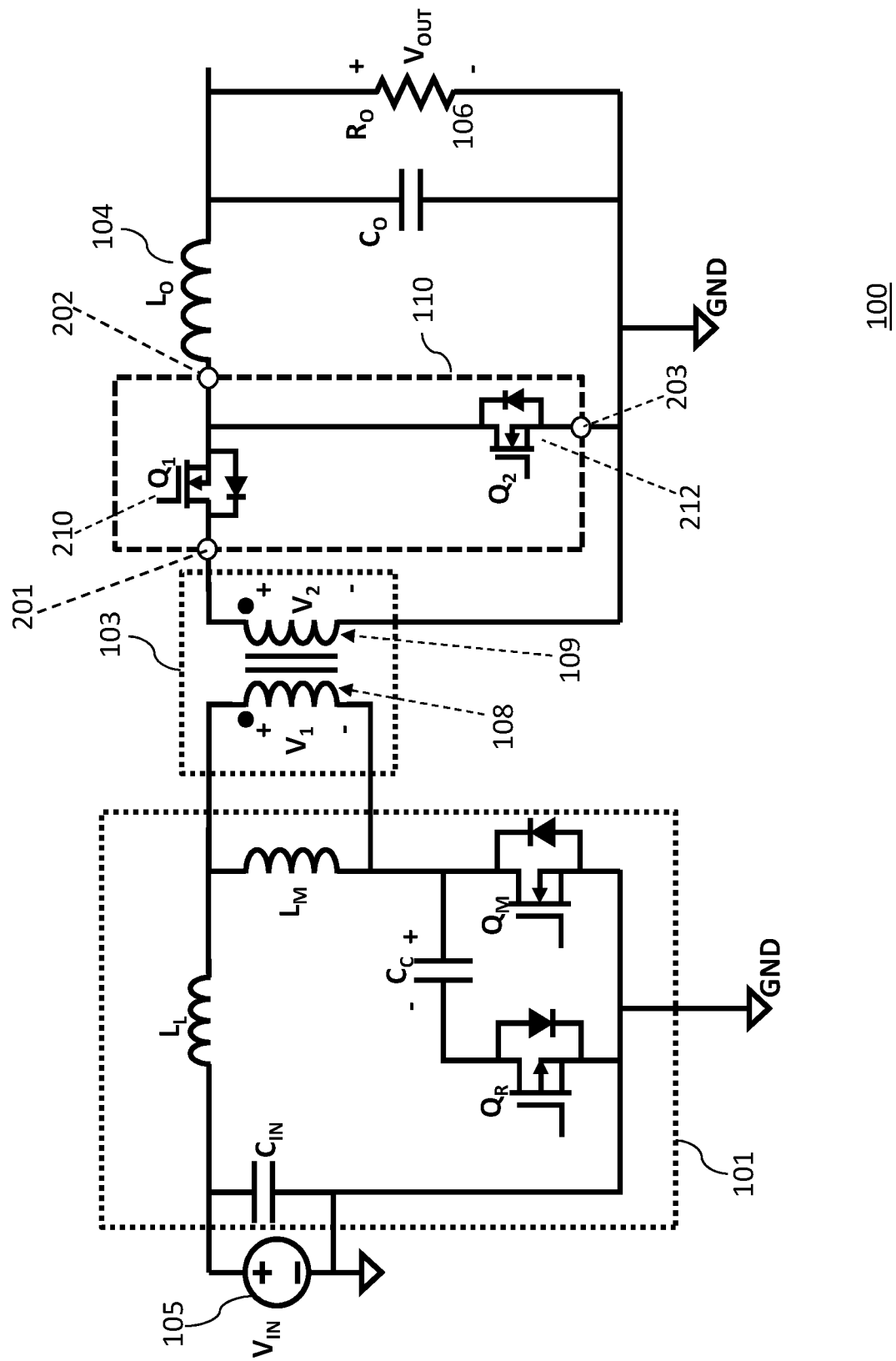
FIG. 2 shows another circuit diagram illustrating a power converter with co-packaged secondary field effect transistors (FETs) in one embodiment.

FIG. 2 shows another circuit diagram illustrating a power converter with co-packaged secondary field effect transistors (FETs) in one embodiment. FIG. 2 may include components that are labeled identically to components of FIG. 1, which are not described again for the purposes of clarity. The description of FIG. 2 may reference at least some of the components of FIG. 1.

In an example embodiment shown in FIG. 2, the circuit 110 can include three terminals 201, 202, and 203, and can include two FETs 210 (denoted as $Q_1$), and 212 (denoted as $Q_2$). In an example embodiment, the FETs 210 and 212 can be N-type FETs. In another example embodiment, the FET 210 can be a P-type FET and the FET 212 can be an N-type FET. In another example embodiment, the FETs 210 and 212 can be P-type FETs. Although the circuit 110 shown in FIG. 2 includes two FETS, other numbers of FETs and various combinations of N-type and P-type FETs are possible, depending on a desirable implementation of the power converter 100. The FETs $Q_1$ and $Q_2$ can be referred to as secondary FETs, such as FETs located in the secondary circuit 102. The terminals 201, 202, and 203 can be external connections that can connect the circuit 110 with other components (e.g., transformer 103 and output inductor 104).

In examples where both FET 210 and 212 are N-type FETs, the current input terminal, of the FET 210 can be connected to the winding 109 of the transformer 103 through the terminal 201. The current output terminal, of the FET 210 can be connected to the output inductor 104 through the terminal 202. The current input terminal of the FET 212, can be connected to ground (GND) through the terminal 203. The current output terminal, of the FET 212 can be connected to the output inductor 104 through the terminal 202. Note that when a FET is an N-type FET, the current input terminal can be the drain terminal and the current output terminal can be the source terminal. When a FET is a P-type FET, the current input terminal can be the source terminal and the current output terminal can be the drain terminal. In some examples, the FET 210 can operate in a similar manner as a forward bias diode to control current flowing from the transformer 103 to the output inductor 104, and the FET 212 can operate in a similar manner as a freewheel diode to eliminate sudden voltage spike seen across an inductive load (e.g., $R_O$) when its supply current is suddenly reduced or interrupted. Further, in some examples, when compared to diodes, FETs can have lower conduction loss when conducting current. In an example embodiment, the FETs 210 and 212 shown in FIG. 2 can be integrated as distinct components in a circuit board being used to construct the power converter 100.

Figure 3:
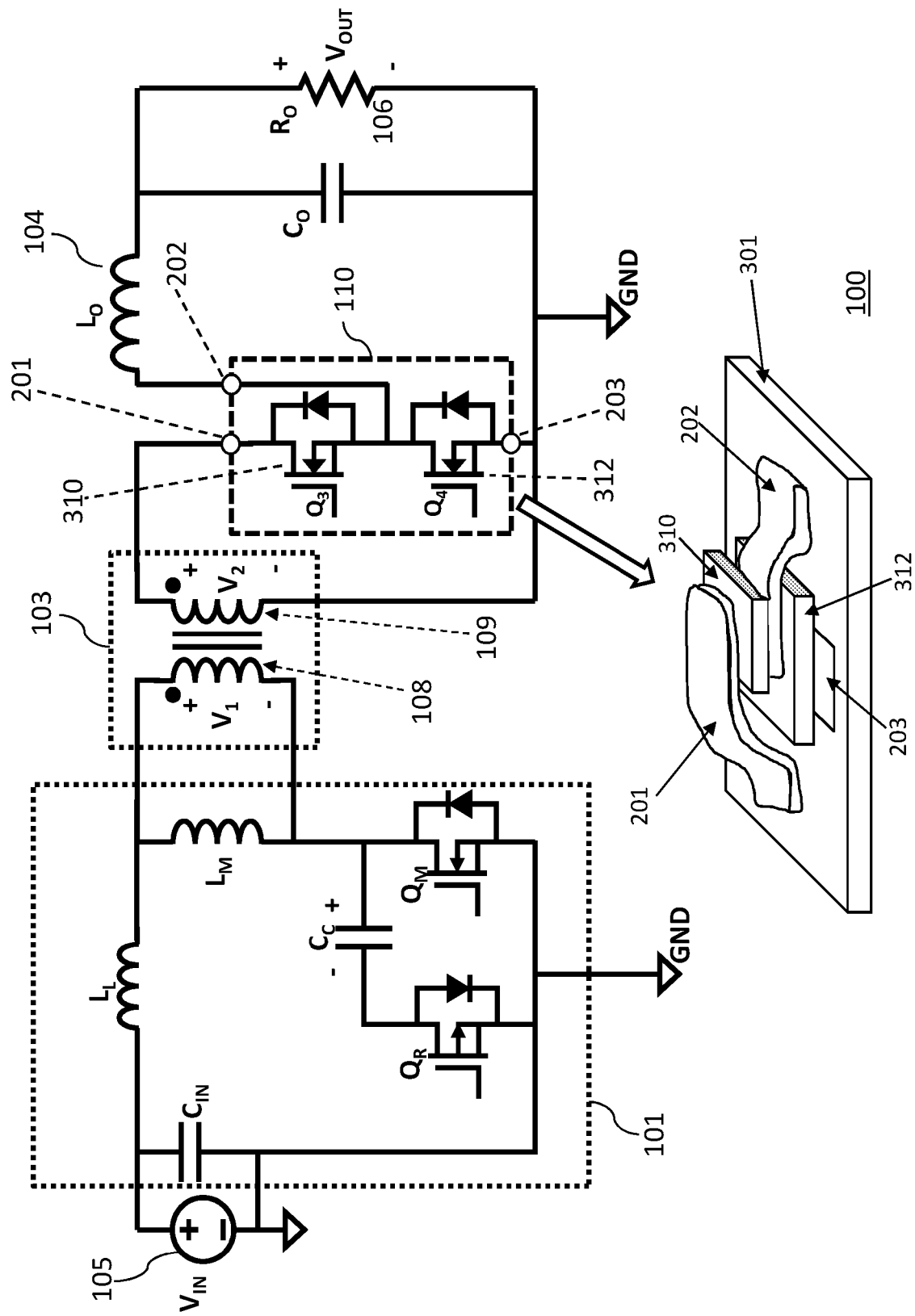
FIG. 3 shows another circuit diagram illustrating a power converter with co-packaged secondary field effect transistors (FETs) in one embodiment.

FIG. 3 shows another circuit diagram illustrating a power converter with co-packaged secondary field effect transistors (FETs) in one embodiment. Such configuration may include a row-column arrangement of circuit components. FIG. 3 may include components that are labeled identically to components of FIGS. 1-2, which will not be described again for the purposes of clarity. The description of FIG. 3 may reference at least some of the components of FIGS. 1-2.

In an example embodiment shown in FIG. 3, the circuit 110 can include two FETs 310 (denoted as $Q_3$), and 312 (denoted as $Q_4$). Each one of the FETs 310 and 312 can be N-type FETs or P-type FETS. The FETs $Q_3$ and $Q_4$ can be referred to as secondary FETs, such as FETs located in the secondary circuit 102. In examples where both FET 310 and FET 312 are N-type FETs, the current input terminal of the FET 310 can be connected to the winding 109 of the transformer 103 through the terminal 201. The current output terminal of the FET 310 can be connected to the drain terminal of the FET 312 via an internal connection. The current output terminal of the FET 312 can be connected to ground (GND) through the terminal 203. The current output terminal of the FET 310 and the current input terminal of the FET 312 can also be connected to the output inductor 104 through the terminal 202. The current flowing into the inductor 104 can be fed from either the current output terminal of the FET 310 or the current input terminal of the FET 312. In some examples, the FETs 310 and/or 312 can operate in a similar manner as a forward bias diode to control current flowing from the transformer 103 to the output inductor 104, and can operate in a similar manner as a freewheel diode to eliminate sudden voltage spike seen across an inductive load (e.g., $R_O$) when its supply current is suddenly reduced or interrupted.

In the example embodiment shown in FIG. 3, the FETs 310 and 312 can be co-packaged, such as being packaged within a single electronic package to form the circuit 110. The FETs 310 and 312 can be co-packaged on the same substrate (e.g., substrate 301) in a stacked configuration (e.g., on top of each other). The circuit 110 can be integrated into a substrate of a circuit board (which can be different from substrate 301) being used to construct the power converter 100 as a single component. In some examples, the FETs 310 and 312 can be vertical FETs where a top surface of a vertical FET is a drain terminal and a bottom surface of the vertical FET is a source terminal. In an example shown in FIG. 3, the terminal 201 can represent a piece or layer of metal (e.g., foil) that can connect the FET 310 to the winding 109. The terminal 202 can represent a piece of metal that can connect the FET 310 and 312 to the output inductor 104. The terminal 203 can represent a metal layer on the substrate 301 that can connect the FET 312 to ground. Co-packaging the FETs 310 and 312 to form the circuit 110 prior to integrating the circuit 110 with other components of the power converter 100 may reduce parasitic loss. Further, the circuit 110 with co-packaged FETs 310 and 312 can occupy a relatively smaller area of a circuit board of the power converter 100 when compared to integrating the FETs 310 and 312 as distinct components.

Figure 4:
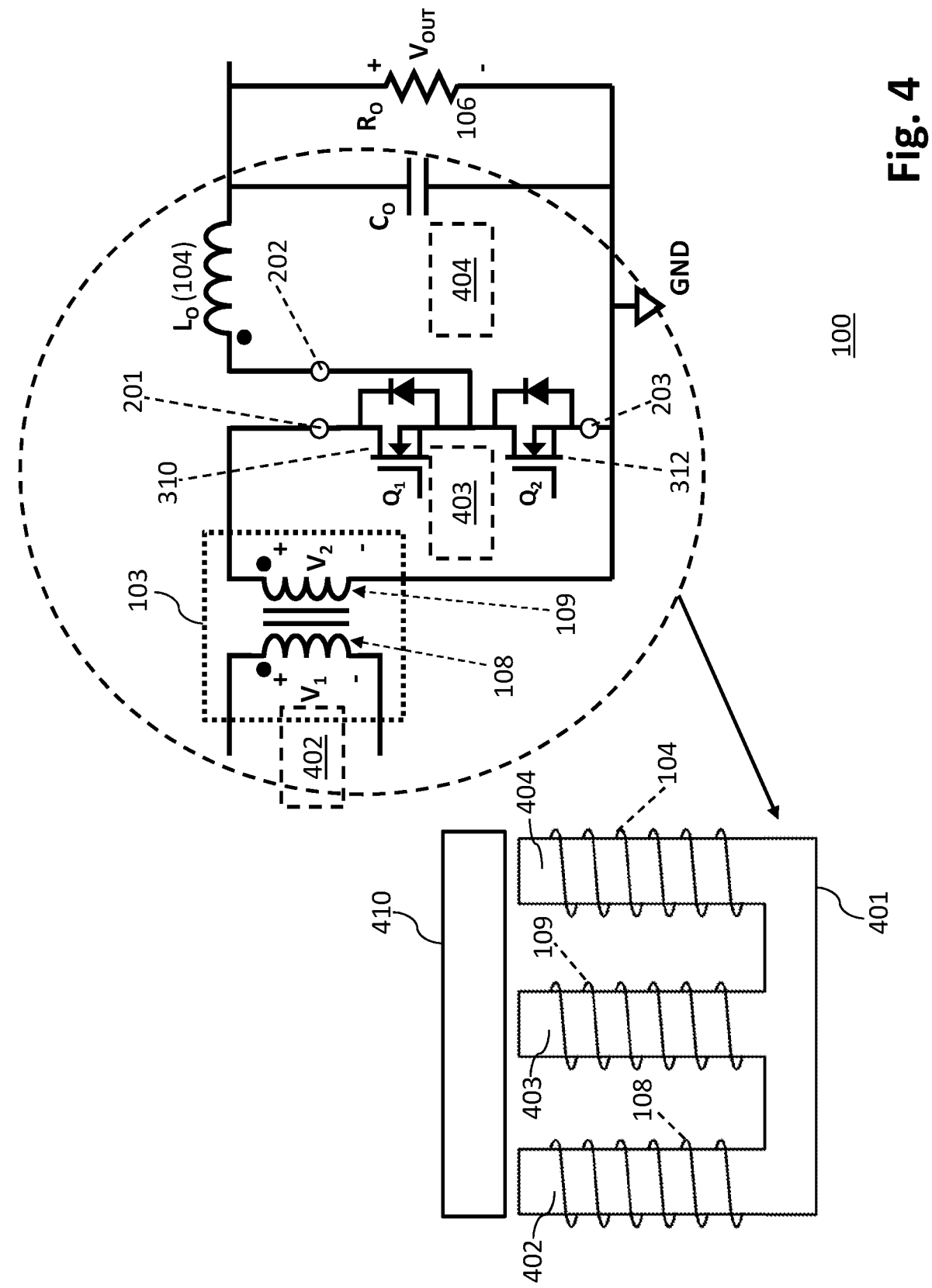
FIG. 4 shows another a circuit diagram illustrating a power converter with co-packaged secondary field effect transistors (FETs) in one embodiment.

FIG. 4 shows another circuit diagram illustrating a power converter with co-packaged secondary field effect transistors (FETs) in one embodiment. FIG. 4 may include components that are labeled identically to components of FIGS. 1-3, which will not be described again for the purposes of clarity. The description of FIG. 4 may reference at least some of the components of FIGS. 1-3.

In an example embodiment shown in FIG. 4, the transformer 103 and the output inductor 104 can be magnetically coupled using a magnetic core. For example, the transformer 103 and the output inductor 104 can be magnetically coupled using a magnetic core 401, where the magnetic core 401 can be an E-shaped magnetic core, or E-core. In the example shown in FIG. 4, the magnetic core 401 can include a leg 402, a leg 403, and a leg 404. The winding 108 of the transformer 103 and the winding 109 of the transformer 103 can be both wrapped around the leg 403 to form a transformer. The winding or output inductor 104 can be wrapped around the leg 404, or the leg 402, or 403 plus 404, or 402 plus 403. In other words, the leg 403 can be wrapped by wires and/or coil (e.g., the winding 109) between the terminal 201 and the terminal 203, and the leg 404 can be wrapped by wires and/or coils (e.g., the winding 104) between terminal 202 and terminal 203. The wrapping of the winding 109 of the transformer 103 around the leg 403, and the wrapping of the inductor 104 around the leg 404, causes the transformer 103 to be magnetically coupled to the output inductor 104.

The power converter 100 can be constructed using the magnetic core 401 and a magnetic core 410, where the magnetic core 410 can be an I-shaped magnetic core, or I-core. In an example, construction of the power converter 100 can include arranging components of the primary circuit 101, the transformer 103, and the output inductor 104 on a substrate or a circuit board. In some examples, the primary circuit 101, the transformer 103, and the output inductor 104 can be arranged or mounted on the circuit board by soldering. The construction of the power converter 100 can further include co-packaging the FET 310 and the FET 312, in a stacked configuration, to form the circuit 110. The circuit 110 can be integrated or mounted on the circuit board that may already include the primary circuit 101, the transformer 103, and the output inductor 104. In some examples, the circuit 110 can be mounted to the circuit board by, for example, surface mount, through-hold mount, flip-chip mount, depending on a configuration of the circuit board. The construction of the power converter 100 can include connecting the circuit 110 (which may be mounted on the circuit board) to the transformer 103 via the terminal 201, and connecting the circuit 110 to the output inductor 104 via the terminal 202. The construction of the power converter 100 can include connecting the circuit 110 (which may be mounted on the circuit board) to a ground pin, or ground terminal, that may be arranged on the circuit board. The connecting of the circuit 110 to the transformer 103 can include wrapping wires and/or coils (e.g., winding 109) around the leg 403 of the magnetic core 401. The connecting of the circuit 110 to the output inductor 104 can include wrapping wires and/or coils around the leg 404 or 402 of the magnetic core 401. The magnetic core 410 can be added to a top side of the magnetic core 401, and can be positioned such that an air gap exists between the magnetic core 410 and the top side of the magnetic core 401.

Figure 5:
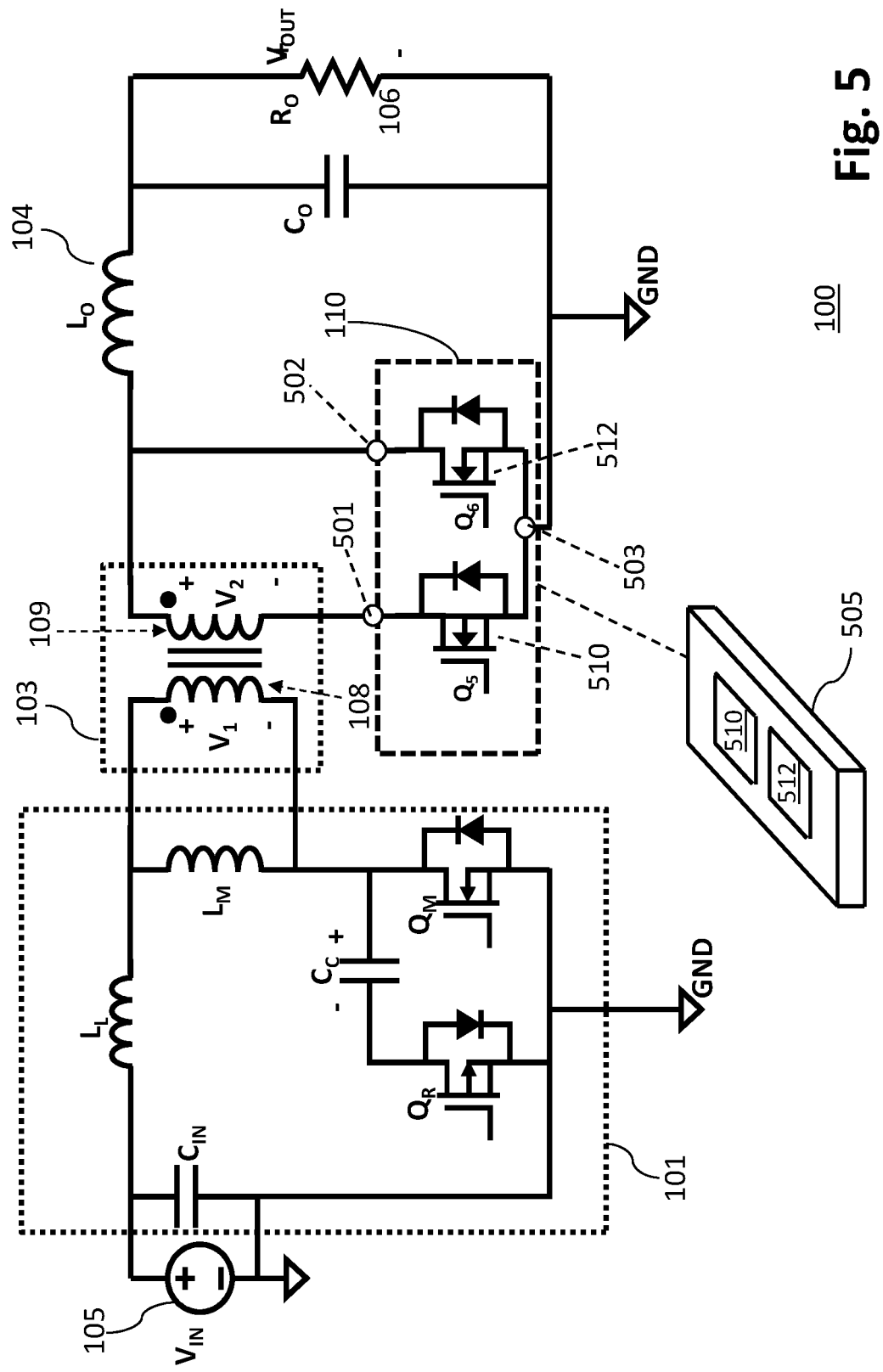
FIG. 5 shows another a circuit diagram illustrating a power converter with co-packaged secondary field effect transistors (FETs) in one embodiment.

FIG. 5 shows another circuit diagram illustrating a power converter with co-packaged secondary field effect transistors (FETs) in one embodiment. FIG. 5 may include components that are labeled identically to components of FIGS. 1-4, which are not described again for the purposes of clarity. The description of FIG. 5 may reference at least some of the components of FIGS. 1-4.

In an example embodiment shown in FIG. 5, the circuit 110 can include two FETs 510 (denoted as $Q_5$), and 512 (denoted as $Q_6$). The FETs 510 and 512 can be N-type FETs. The FETs $Q_5$ and $Q_6$ can be referred to as secondary FETs, such as FETs located in the secondary circuit 102. The drain terminal of the FET 510 can be connected to the winding 109 of the transformer 103 through a terminal 501. The source terminal of the FET 510 and the source terminal of the FET 512 can be connected to ground (GND) through the terminal 503. The drain terminal of the FET 512 can be connected to the output inductor 104 through the terminal 502. In some examples, the FETs 510 and/or 512 can operate in a similar manner as a forward bias diode to control current flowing from the transformer 103 to the output inductor 104, and can operate in a similar manner as a freewheel diode to eliminate sudden voltage spike seen across an inductive load (e.g., $R_O$) when its supply current is suddenly reduced or interrupted.

In the example embodiment shown in FIG. 5, the FETs 510 and 512 can be co-packaged, such as being packaged within a single electronic package to form the circuit 110. The FETs 510 and 512 can be co-packaged on the same substrate (e.g., a substrate 505) in a stacked configuration. Co-packaging the FETs 510 and 512 to form the circuit 110 prior to integrating the circuit 110 with other components of the power converter 100 may reduce parasitic loss. Further, the circuit 110 with co-packaged FETs 510 and 512 can occupy a relatively smaller area of a circuit board of the power converter 100 when compared to integrating the FETs 510 and 512 as distinct components.

FIG. 6 is a flow diagram illustrating a process 600 that can be performed to construct a power converter with co-packaged secondary field effect transistors (FETs) in one embodiment. An example process may include one or more operations, actions, or functions as illustrated by one or more of blocks 602, 604, 606, and/or 608. Although illustrated as discrete blocks, various blocks can be divided into additional blocks, combined into fewer blocks, eliminated, or performed in parallel, depending on the desired implementation.

The process 600 can begin at block 602, where a circuit, a transformer, and an inductor can be arranged on a circuit board. The process 600 can continue from block 602 to block 604. At block 604, the transformer can be connected to an output of the circuit. The process 600 can continue from block 604 to block 606. At block 606, a package that comprises a first field-effect transistor (FET) and a second FET can be formed. The process 600 can continue from block 606 to block 608. At block 608, the first FET of the package can be connected to the transformer and to the inductor. The process 600 can continue from block 608 to block 610. At block 610, the second FET of the package can be connected to the first FET and a ground terminal of the circuit board. In an example, the first FET and the second FET can be co-packaged in a stacked configuration.

In an example embodiment, the layer of substrate can include a metal layer that can facilitate connections to ground. The second FET can be disposed on top of the metal layer to connect a terminal, such as a current output terminal, of the second FET to ground. A first metal layer can be disposed on top of the second FET, where the first metal layer can operate as a terminal to connect another terminal, such as a current input terminal, of the second FET to one or more components external to the second FET. The first FET can be disposed on top of the first metal layer to connect a terminal, such as a current output terminal, of the first FET to the current input terminal of the second FET via the first metal layer. A second metal layer can be disposed on top of the first FET to connect another terminal, such as current input terminal, of the first FET to one or more components external to the first FET. The transformer can be connected to the first FET via the second metal layer, and the inductor can be connected to the first FET via the first metal layer.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
a transformer mounted on a circuit board;
an inductor mounted on the circuit board; and
a circuit including a first field-effect transistor (FET) that is implemented as a forward bias device in a secondary circuit of a forward converter and a second FET that is implemented as a freewheel device in the secondary circuit of the forward converter, wherein:
the first FET and the second FET are co-packaged to form an electronic package;
the first FET and the second FET are arranged in a stacked configuration on a substrate inside the electronic package, wherein the substrate is different from the circuit board mounted with the transformer and the inductor;
the circuit including the co-package first FET and second FET is mounted on the circuit board such that the first FET is coupled between the transformer and the inductor that are mounted on the circuit board; and
the circuit is mounted on the circuit board such that the second FET is coupled between the first FET and ground.

2. The structure of claim 1, wherein:
the circuit comprises a first terminal, a second terminal, and a third terminal;
the first FET is connected to the transformer through the first terminal;
the first FET is connected to the inductor through the second terminal;
the second FET is connected to the first FET; and
the second FET is connected to ground through the third terminal.

3. The structure of claim 2, wherein:
a current input terminal of the first FET is connected to the output of the transformer through the first terminal;
a current output terminal of the first FET is connected to the inductor through the second terminal;
a current output terminal of the second FET is connected to the inductor through the second terminal; and
a current input terminal of the second FET is connected to ground through the third terminal.

4. The structure of claim 2, wherein:
a current input terminal of the first FET is connected to the output of the transformer through the first terminal;
a current output terminal of the first FET is connected to the inductor through the second terminal;
a current output terminal of the second FET is connected to the current output terminal of first FET; and
a current input terminal of the second FET is connected to ground through the third terminal.

5. The structure of claim 1, wherein the first FET and the second FET are N-type FETs.

6. The structure of claim 1, wherein the transformer and the inductor are magnetically coupled.

7. The structure of claim 6, wherein the transformer and the inductor are magnetically coupled using an E-core.

8. The structure of claim 1, wherein the first FET and the second FET are vertical FETs.

9. The structure of claim 1, wherein the forward converter is an active clamp forward converter.

10. A power converter comprising:
a first circuit mounted on a circuit board, wherein the first circuit is implemented as a primary circuit of a forward converter;
a transformer mounted on the circuit board and connected to an output of the first circuit;
a second circuit connected to an output of the transformer, wherein the second circuit is implemented as a secondary circuit of a forward converter, and the second circuit comprises:
an inductor mounted on the circuit board; and
an electronic package mounted on the circuit board, the electronic package including:
a first field-effect transistor (FET) coupled between the transformer and the inductor, wherein the first FET is implemented as a forward bias device in the secondary circuit of the forward converter;
a second FET coupled between the first FET and ground, wherein the second FET is implemented as a freewheel device in the secondary circuit of the forward converter, the first FET and the second FET are co-packaged to form the electronic package, and the first FET and the second FET are in a stacked configuration on a substrate inside the electronic package, wherein the substrate is different from the circuit board mounted with the transformer and the inductor.

11. The power converter of claim 10, wherein:
the electronic package comprises a first terminal, a second terminal, and a third terminal;
the first FET is connected to the transformer through the first terminal;
the first FET is connected to the inductor through the second terminal;
the second FET is connected to the first FET; and
the second FET is connected to ground through the third terminal.

12. The power converter of claim 11, wherein:
a current input terminal of the first FET is connected to the output of the transformer through the first terminal;
a current output terminal of the first FET is connected to the inductor through the second terminal;
a current output terminal of the second FET is connected to the inductor through the second terminal; and
a current input terminal of the second FET is connected to ground through the third terminal.

13. The power converter of claim 11, wherein:
a current input terminal of the first FET is connected to the output of the transformer through the first terminal;
a current output terminal of the first FET is connected to the inductor through the second terminal;
a current output terminal of the second FET is connected to the current output terminal of first FET; and
a current input terminal of the second FET is connected to ground through the third terminal.

14. The power converter of claim 10, wherein the first FET and the second FET are N-type FETs.

15. The power converter of claim 10, wherein the transformer and the inductor are magnetically coupled.

16. The structure of claim 15, wherein the transformer and the inductor are magnetically coupled using an E-core.

17. The power converter of claim 10, wherein the first circuit comprises:
a main FET;
an auxiliary FET, wherein the main FET and auxiliary FET are switched to cause current to flow from the first circuit to the second circuit through the transformer; and
a clamping capacitor configured to reset residual energy flux from the transformer.

18. A method of constructing a power converter, the method comprising:
mounting a transformer and an inductor on a circuit board;
connecting the transformer to an output of the circuit;
forming an electronic package that comprises a first field-effect transistor (FET) that is implemented as a forward bias device of a secondary circuit of a forward converter and a second FET that is implemented as a freewheel device of the secondary circuit of the forward converter, wherein the first FET and the second FET are in a stacked configuration on a substrate inside the electronic package, and the substrate is different from the circuit board;
mounting the electronic package on the circuit board;
connecting the first FET of the electronic package to the transformer and the inductor mounted on the circuit board; and
connecting the second FET of the electronic package to the first FET and a ground terminal of the circuit board.

19. The method of claim 18, wherein the electronic package comprises a first terminal, a second terminal, and a third terminal, and the method comprises:
connecting a current input terminal of the first FET to the transformer through the first terminal;
connecting a current output terminal of the first FET to the inductor through the second terminal;
connecting a current output terminal of the second FET to the current output terminal of first FET; and
connecting a current input terminal of the second FET to the ground terminal of the circuit board through the third terminal.

20. The method of claim 18, wherein the electronic package comprises a first terminal, a second terminal, and a third terminal, and the method comprises:
connecting a current input terminal of the first FET to the transformer through the first terminal;
connecting a current output terminal of the first FET to the inductor through the second terminal;
connecting a current output terminal of the second FET to the inductor through the second terminal; and
connecting a current input terminal of the second FET to the ground terminal of the circuit board through the third terminal.

* * * * *